United States Patent
Park et al.

(10) Patent No.: US 9,263,890 B2
(45) Date of Patent: Feb. 16, 2016

(54) POWER MANAGEMENT APPARATUS AND METHOD FOR CONTROLLING THE SAME

(71) Applicant: SAMSUNG ELECTRONICS CO., LTD., Suwon (KR)

(72) Inventors: Hyun Soo Park, Seoul (KR); Young Jin Park, Bucheon (KR); Sung Mok Seo, Seoul (KR); Jong Hyun Shin, Suwon (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 500 days.

(21) Appl. No.: 13/659,317

(22) Filed: Oct. 24, 2012

(65) Prior Publication Data

US 2013/0106185 A1    May 2, 2013

(30) Foreign Application Priority Data

Oct. 28, 2011    (KR) .................. 10-2011-0111224

(51) Int. Cl.
*H02J 3/14*    (2006.01)
*H02J 3/00*    (2006.01)
*G01R 19/25*    (2006.01)

(52) U.S. Cl.
CPC ............... *H02J 3/00* (2013.01); *G01R 19/2513* (2013.01); *Y10T 307/406* (2015.04)

(58) Field of Classification Search
CPC ................. H02J 4/00; H02J 3/00; H02J 3/14
USPC ............................. 307/31, 140; 700/224, 291
See application file for complete search history.

(56) References Cited

U.S. PATENT DOCUMENTS

| | | | | |
|---|---|---|---|---|
| 6,301,674 | B1 * | 10/2001 | Saito et al. ..................... | 713/340 |
| 6,950,460 | B1 * | 9/2005 | Cappelletti et al. ............ | 375/222 |
| 2007/0268063 | A1 * | 11/2007 | Wasaki et al. ................. | 327/532 |
| 2008/0107242 | A1 * | 5/2008 | Ichihara et al. ............... | 379/1.03 |
| 2009/0198384 | A1 * | 8/2009 | Ahn .............................. | 700/292 |

* cited by examiner

*Primary Examiner* — Jared Fureman
*Assistant Examiner* — Rafael Pacheco
(74) *Attorney, Agent, or Firm* — Staas & Halsey LLP

(57) ABSTRACT

A power management apparatus including an information collecting unit configured to collect at least one reference electric signal and at least one product information that correspond to at least one load, a storage unit configured to store the collected at least one reference electric signal and the collected at least one product information that correspond to the at least one load, a measurement unit configured to measure electric signals of loads provided in a power management domain, and a control unit configured to find a reference electric signal, corresponding to the measured electric signal, among the stored reference electric signals, check product information corresponding to the found electric signal and display the checked product information. The reference electric signal of each load is acquired in advance, and electric signals of loads are distinguished among all electric signals, thereby enhancing the efficiency in recognizing each load.

22 Claims, 8 Drawing Sheets

POWER MANAGEMENT APPARATUS AND METHOD FOR CONTROLLING THE SAME

CROSS-REFERENCE TO RELATED APPLICATIONS

This application claims the benefit of Korean Patent Application No. 2011-0111224, filed on Oct. 28, 2011 in the Korean Intellectual Property Office, the disclosure of which is incorporated herein by reference.

BACKGROUND

1. Field

Embodiments of the present disclosure relate to a power management apparatus for measuring the power consumption of each load, and a method for controlling the same.

2. Description of the Related Art

With the development of Information Technology (IT), the number of household appliances powered by electricity is rapidly increasing, in turn leading to increasing power consumption.

Accordingly, the electric power companies remotely measure the power consumption of a power consumption side by performing a wired/wireless communication with a consumer consuming power, and control the production and supply of power based on the result of remote measurement, thereby achieving a stable supply of power to the consumer while preventing an overload at the power equipment.

In addition, since a power meter configured to measure the power consumption and to output the measured power consumption is installed at a side of the consumer, the power consumption is controlled by monitoring the power meter.

In recent years, the technology regarding the profile of power has been increasingly developed, and many studies have been undertaken on the technology through analysis of the remote measurement data so as to improve the billing system, enhance customer service and provide added values, establish sales strategies, develop policies for energy and demand/supply of power, and establish investment plans in equipment.

For the analysis technology on the profile of power, the power consumption on a daily basis is determined, the power consumption is monitored daily, monthly, and annually, and the operation of a certain load is temporarily stopped according to the result of monitoring such that the total of power consumption is reduced.

In this manner, the total of power consumption is reduced, but the efficiency of reducing the power consumption is not improved.

Accordingly, the power consumption for each load within a power management domain is measured by use of a power measurement apparatus provided at a side of the consumer, and the measured power consumption is displayed through the power measurement apparatus. A consumer may check the power management apparatus, and temporarily stop the operation of at least one load based on the information that is displayed on the power management apparatus, so that the power consumption in the power management domain is effectively reduced.

To this end, the power management apparatus needs to be provided at an inside of an electric appliance corresponding to the load, or at an outside while being connected to the electric appliance.

In this case, the manufacturing cost of the electric appliance is increased from the position of the manufacturer, and the purchase price of the electric appliance is increased, or the additional purchase of the power measurement apparatus is required from the position of the consumer, and thus economically undesirable. In addition, there is an inconvenience of reinstalling each load.

In addition, when the power measurement apparatus is provided at each of a plurality of loads, a power consumption transmitted through each power measurement apparatus makes it difficult to determine which load the power consumption corresponds to.

SUMMARY

Therefore, it is an aspect of the present disclosure to provide a power management apparatus that is configured to collect and store unique information included in an electric signal of each load in advance, extract unique information from an electric signal measured in a power management domain at a later time to determine a load in operation, and output product information and power consumption of the determined load, and a method for controlling the same.

Additional aspects of the disclosure will be set forth in part in the description which follows and, in part, will be apparent from the description, or may be learned by practice of the disclosure.

In accordance with one aspect of the present disclosure, a power management apparatus includes an information collecting unit, a control unit and a storage unit. The information collecting unit may be configured to collect at least one reference electric signal and at least one product information that correspond to at least one load. The control unit may be configured to control a storage of the at least one reference electric signal and the at least one product information that correspond to the at least one load. The storage unit may be configured to store the collected at least one reference electric signal and the collected at least one product information that correspond to the at least one load.

The power management apparatus may further include a measurement unit configured to measure all electric signals of a plurality of loads provided in a power management domain. The control unit may control such that an electric signal corresponding to the stored at least one reference electric signal is checked among the all electric signals, product information corresponding to the checked electric signal is checked, power consumption corresponding to the checked electric signal is checked, and the checked product information and the checked power consumption are displayed.

The information collecting unit may further include an input unit configured to receive the product information of the load and a collection command, which are used to collect the reference electric signal of the load. The control unit, if the product information of the load and the collection command are input, operates a load, of which the product information is input, during a predetermined period of time, and receives the reference electric signal from the measurement unit while the load, of which the product information is input, is being operated.

The information collecting unit may further include an input unit configured to receive the product information of the load and a start command and a finish command, the start command and the finish command being used to collect a reference electric signal of the load, and the control unit operates the load, of which the product information is input, during a period of time from receiving the start command to receiving the finish command, and receives the reference electric signal from the measurement unit while the load, of which the product information is input, is being operated.

The power management apparatus may further include an output unit configured to output product information of the checked load, a status of operation/non operation of the checked load, and power consumption of the checked load.

The power management apparatus may further include a communication unit configured to communicate with an external display apparatus. The control unit may output the product information of the checked load and the power consumption of the checked load to the display apparatus.

The information collecting unit may include an input unit configured to receive the product information of the load and a communication unit configured to communicate with a server. The control unit may control such that a reference electric signal corresponding to the product information input is requested and the reference electric signal received through the communication unit is stored.

The information collecting unit may include an imaging unit configured to acquire a code image provided on the load, and a communication unit configured to communicate with a server. The control unit may control such that a reference electric signal corresponding to the code image is requested from a server and the reference electric signal received through the communication unit is stored.

The information collecting unit may include a communication unit configured to communicate with a terminal. The control unit may control a storage of the product information of the load and the reference electric signal of the load which are transmitted from the terminal through the communication unit.

The information collecting unit may include at least one of an input unit, an imaging unit, and a communication unit, the input unit configured to receive a command to collect the product information of the load and the reference electric signal of the load, the imaging unit configured to acquire a code image of the load, and the communication unit configured to communicate with a server. The control unit, if the command to collect the reference electric signal of the load is input, may operate the load and receive the electric signal, which is measured during the operation of the load, and if at least one of the product information of the load and the code image of the load is input, controls such that a server is requested of a reference electric signal to acquire the reference electric signal.

The information collecting unit may acquire unique information from the at least one reference electric signal corresponding to the at least one load. The storage unit may store the unique information of the at least one reference electric signal corresponding to the at least one load, the unique information acquired by the information collecting unit. The control unit may acquire unique information from the measured electric signal, and determine unique information of a reference electric signal corresponding to the unique information of the measured electric signals among the unique information of the at least one reference electric signal of the at least one load stored in the storage unit.

The reference electric signal may include at least one of a power signal, a voltage signal, and a current signal that are stored in advance to determine a load within the power management domain. The measurement unit may measure at least one of power, voltage, and current, and output at least one of the power signal, the voltage signal, and the current signal.

The unique information may be a high frequency signal within the at least one of the power signal, the current signal, and the voltage signal.

The unique information may be a harmonics component within the at least one of the power signal, the current signal, and the voltage signal.

The unique information may be an active power and a reactive power that are calculated based on the voltage signal and the current signal.

The unique information comprises at least two of a high frequency signal within the power signal, a high frequency signal within the current signal, a high frequency signal within the voltage signal, a harmonics component within the power signal, a harmonics component within the current signal, a harmonics component within the voltage signal, and an active power and a reactive power that are calculated based on the voltage signal and the current signal.

In accordance with another aspect of the present disclosure, a method for controlling a power management is as follows. Product information of a load is received. The load is operated if an operation command for the load is input. An electric signal of the load is measured while the load is being operated. The measured electric signal is stored as a reference electric signal of the load.

The method may further include measuring all electric signals of a plurality of loads provided in a power management domain, checking an electric signal, corresponding to the stored reference electric signal, among all the electric signals, checking product information corresponding to the checked electric signal, checking power consumption corresponding to the checked electric signal among all the electric signals, and outputting the product information and the power consumption that are checked.

The operating of the load may include operating the load during a predetermined period of time.

The operating of the load may include operating a load during a time from receiving a start command to receiving a finish command, the start command and the finish command configured to collect the reference electric signal of the load.

The outputting of the product information of the load and the power consumption of the load that are checked may include outputting the product information and the power consumption to an external display apparatus through communication.

In accordance with another aspect of the present disclosure, a method for controlling a power management apparatus is as follows. If product information of a load is input, a server is requested to provide a reference electric signal corresponding to the product information of the load. If the reference electric signal is transmitted from the server, the transmitted reference electric signal and the product information are stored.

The method may further include measuring all electric signals of a plurality of loads provided within a power management domain, checking an electric signal, corresponding to the stored reference signal, among all the electric signals, checking product information corresponding to the checked electric signal, checking power consumption corresponding to the checked electric signal among all the electric signals, and outputting the product information and the power consumption that are checked.

The checking of the electric signal, corresponding to the stored reference electric signal, among all the electric signals may include comparing unique information of all the electric signals with unique information of the reference electric signal.

The electric signal may be one of a power signal, a voltage signal and a current signal, and the unique information may include at least one of a high frequency signal within the power signal, a high frequency signal within the current signal, a high frequency signal within the voltage signal, a harmonics component within the power signal, a harmonics component within the current signal, a harmonics component within the voltage signal, and an active power and a reactive power that are calculated based on the voltage signal, and the current signal.

The receiving of the product information of the load may include receiving at least one of a serial number, a product name, a model name, a consecutive number, and a product number.

The receiving of the product information of the load may include receiving a code image of the load from a terminal.

In accordance with another aspect of the present disclosure, a method for controlling a power management apparatus is as follows. Product information and a reference electric signal of a load may be received from a terminal. The product information and the reference electric signal of the load that are received may be stored.

The method may further include measuring all electric signals of a plurality of loads provided within a power management domain, checking an electric signal, corresponding to the stored reference electric signal, among all the electric signals, checking product information corresponding to the checked electric signal, checking power consumption corresponding to the checked electric signal among all the electric signals, and outputting the product information and the power consumption that are checked.

The checking of the electric signal, corresponding to the stored reference electric signal, among all the electric signals may include comparing unique information of all the electric signals with unique information of the reference electric signal, wherein the unique information may include at least one of a waveform pattern of the electric signal, power consumption of the electric signal, a feature point of the electric signal at a start operation, a difference between an active power and a reactive power of the electric signal, and a noise component within a predetermined frequency band of the electric signal.

As described above, a reference electric signal of each load is acquired in advance, and then a plurality of loads are divided, thereby enhancing the efficiency of recognizing the load as compared with dividing a plurality of loads from the total power signal that is measured at a time.

In addition, the precision of analysis on the power consumption for each load is improved, so that the power consumption is effectively reduced, and the load is efficient and easy to manage.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
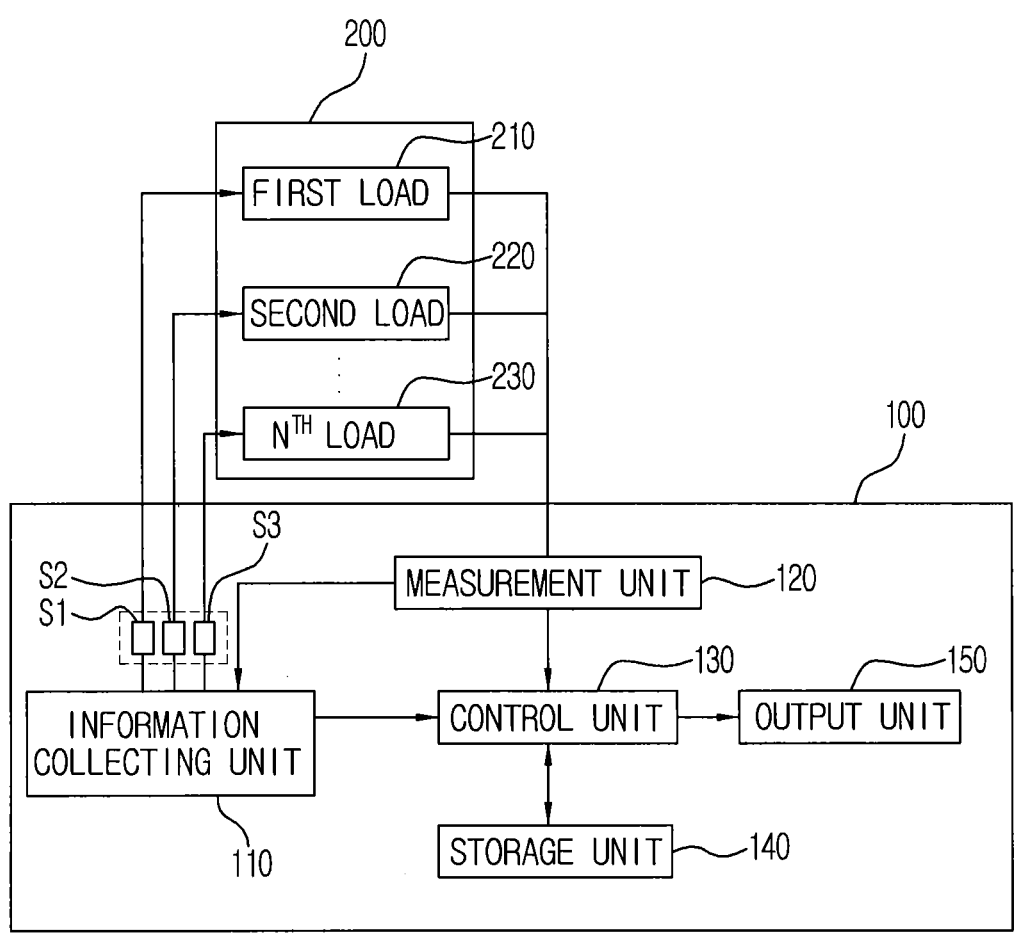
FIG. 1 is a block diagram illustrating a power management apparatus in accordance with an embodiment of the present disclosure

Reference will now be made in detail to the embodiments of the present disclosure, examples of which are illustrated in the accompanying drawings, wherein like reference numerals refer to like elements throughout.

FIG. 1 is a block diagram illustrating a power management apparatus in accordance with an embodiment of the present disclosure. The power management apparatus 100 includes an information collecting unit 110, a measurement unit 120, a control unit 130, a storage unit 140, and an output unit 150.

The power management apparatus 100 is configured to measure each power consumption of a plurality of loads 200, including a first load 210, a second load 220, and a third load 230, all of which correspond to a target for power management, and to output the measured power consumption together with product information, so that the operation of each load is appropriately controlled, thereby enhancing the efficiency in using each load and reducing the power consumption.

The information collecting unit 110 is configured to collect electric signals and product information of at least one of a plurality of loads provided within a power management domain.

The information collecting unit 110 includes an input unit on which an on/off button, a collection button, a plurality of letter buttons, and a plurality of number buttons are provided.

The on/off button is configured to receive a power on/off command, and the collection button is configured to receive a command for operating a load so as to collect a reference electric signal. The plurality of letter buttons and the plurality of number buttons are configured to receive product information of load, such as the name of a load, the name of a product, and the family of a product (for example, the refrigerator family and the washing machine family).

The on/off button is implemented as one unit of on/off button. The on/off button generates an on-command for one input and an off-command for a sequential input. The on/off button is provided in a single button The input unit of the information collecting unit 110 may be provided at an outside the power management apparatus as a separate unit. That is, the input unit of the information collecting unit 110 may include a key pad that is electrically connected to the power management apparatus.

The information collecting unit 110, if one of the plurality of loads is selected, receives the load name or the product name of the selected load, operates the selected load, and receives a reference electric signal for the load from the measurement unit 120.

The information collecting unit 110 is connected to each load through switches S1 to Sn, and is configured to control the operation of at least one of the plurality of loads by controlling the on/off operation of the switches S1 to Sn.

The switch may automatically implement the on/off operation according to a command of the information collecting unit 110, or the on/off operation of the switch may be manually implemented by a user.

Selecting one of the loads represents controlling one among the plurality of switches such that the corresponding switch becomes an on-state and thus only a load connected to the corresponding switch is electrically connected to the information collecting unit 110.

In this case, a user checks a load in operation, and inputs product information of the checked load. That is, the information collecting unit 110 receives product information of the load in operation.

In addition, selecting one of the loads represents allowing one of the switches to be in the on-state through a selection by a user such that only a load connected to the corresponding switch is electrically connected to the information collecting unit 110.

In this case, a user inputs product information of the load connected to the corresponding switch.

If the user has a difficulty in checking the connection between the switch and the load, the user may check a load in operation and input product information of the load in operation. In this manner, the information collecting unit 110 receives product information of a load selected by a user.

Hereinafter, a process of acquiring a reference electric signal the information collecting unit 110 will be described in detail.

For example, if the on-button is input, the information collecting unit 110 turns on the power of the information collecting unit 110. If one of the loads is selected, the information collecting unit 110 receives product information of the selected load through the plurality of letter buttons and number buttons. If a collection button is input, the information collecting unit 110 operates the selected load for a predetermined period of time. If the predetermined period of time passes, the information collecting unit 110 stops the operation of the selected load.

The information collecting unit 110 receives a reference electric signal that is measured for the predetermined period of time, and turns off the power of the information collecting unit 110 if the off-button is input, thereby completing with collection of the reference electric signal of the load within the power management domain.

For example, if the on-button is input, the information collecting unit 110 turns on the power of the information collecting unit 110. If one of the loads is selected, the information collecting unit 110 receives product information of the selected load through the plurality of letter buttons and number buttons. If a collection button is input, the information collecting unit 110 operates the selected load. If a collection button is input again, the information collecting unit 110 stops the operation of the selected load.

The information collecting unit 110 receives a reference electric signal that is measured for a period of time between a point of time, at which the collection button is primarily input, and a point of time, at which the collection button is secondarily input.

For example, the information collecting unit 110, in a case that reference electric signals for a plurality of loads are collected together, determines a sequence in which the reference electrical signals of the plurality of loads are acquired, sequentially operates the plurality of loads for a predetermined period of time, and sequentially receives the reference electric signals of the plurality of loads that operate for the predetermined period of time.

In this case, a user checks a sequence in which the loads operate, and input product information of the plurality of loads according to the checked order. That is, the information collecting unit 110 receives product information of the plurality of loads according to a predetermined order.

After the reference electric signal is acquired, the information collecting unit 110 extracts unique information, representing a feature of each load, from the reference electric signal. The unique information, representing a feature of each load, is different among loads. Accordingly, the loads are distinguished from each other by extracting the unique information representing each load from the reference electric signal of each load.

In addition, an electric signal which is measured to collect information is stated as a reference electric signal such that the electric signal is distinguished from an electric signal which is measured for distinguishing the load and calculating the power consumption.

The unique information includes at least one of a waveform of a power signal of an electric signal, a characteristic waveform included in a power signal at a start operation, a noise component of a predetermined frequency band included in a power signal, a harmonics component for a fundamental frequency included in a power signal, a high frequency signal included in a power signal, a power consumption and a pattern information thereof.

In addition, the unique information includes at least one of a waveform of a voltage signal of an electric signal, a characteristic waveform included in a voltage signal at a start operation, a noise component of a predetermined frequency band included in a voltage signal, a harmonics component for a fundamental frequency included in a voltage signal, a high frequency signal included in a voltage signal, and a pattern information thereof.

In addition, the unique information includes at least one of a waveform of a current signal of an electric signal, a characteristic waveform included in a current signal at a start operation, a noise component of a predetermined frequency band included in a current signal, a harmonics component for a fundamental frequency included in a current signal, a high frequency signal included in a current signal, and a pattern information thereof.

In addition, the unique information is a power factor representing the ratio of the active power to the apparent power that is calculated based on the current signal and the voltage signal of the electric signal.

The power factor is a coefficient representing the size of a phase difference between a voltage and a current. When a voltage is V, a current is A, the phase difference is $\theta$ and the active power is W ($=$VA cos $\theta$) while the power factor is W/VA$=$VA cos $\theta$/$=$cos $\theta$.

That is, the power factor is desirable as reaching to 1. In addition, the reactive power is VA sin $\theta$.

The apparent power is the power indicating the load of alternating current power or the capacity of power source, that is, the power supplied from a commercial power source. The active power represents power that is used by the load in practice while the reactive power, which does not perform work, is unavailable in the use of power at the load.

The power factor, the active power and the reactive power are different among loads.

The information collecting unit 110 acquires at least one piece of unique information for recognizing the load.

In addition, the process of instructing the load, which corresponds to an object for acquisition of the reference electric signal, to operate may be performed by the information collecting unit, and the process of acquiring the reference electric signal and the unique information of the reference electric signal through the measurement unit may be performed by the control unit 130.

If the unique information of the load is one of the differences between the active power and the reactive power, the power consumption and the power factor, the information collecting unit 110 may directly receive the unique information such as the power consumption, the power factor, and the difference between the active power and the reactive power which may be provided at the purchase of the load.

The information collecting unit 110, when acquiring unique information based on a power signal, may generate a power signal based on a voltage signal and a current signal, which are transmitted from the measurement unit 120, and then acquire unique information based on the generated power signal.

The information collecting unit 110, when acquiring unique information based on a power signal, may generate a power signal based on a current signal and a predetermined voltage signal if only the current signal is transmitted from the measurement unit 120, and then acquire unique information based on the generated power signal.

The measurement unit 120 measures at least one electric signal of at least one load provided within a predetermined power management domain, and transmits the measured electric signal to the information collecting unit 110 and the control unit 130. The electric signal includes at least one of a power signal, a voltage signal, and a current signal.

The measurement unit 120 includes at least one of a voltage measurement unit configured to measure the voltage of a single phase or three phase power, a current measurement unit configured to measure the current, and a power measurement unit configured to measure the power.

The measurement unit 120 may include a current measurement unit configured to measure the current and a voltage measurement unit connected to two contact points of a power source terminal (a single phase) or to three contact points of a power source terminal (a three phase) to measure the voltage at the two contact points or the three contact points, and output a power calculated as a function of the voltage and the current. In this case, the power may be calculated by the information collecting unit and the control unit.

The measurement unit 120 includes an ammeter connected in the middle of a connecting wire or a coil (Current Transformer: CT) wound around a connecting wire.

In addition, the measurement unit 120 may only include a current measurement unit configured to measure the current flowing to the load. In this case, the measurement unit 120 calculates the power based on a constant voltage and the measure current, and outputs the calculated power. In this case, the power may be calculated by the information collecting unit and the control unit.

That is, since a commercial power is supplied to each load, and thus each load is applied with a constant voltage. Accordingly, the constant voltage is acquired in advance and is stored in the measurement unit 120 such that the stored constant voltage is used when the measurement unit 120 outputs the power.

The control unit 130 receives an electric signal from the measurement unit 120, acquires unique information from the transmitted electric signal, determines unique information of a reference electric signal, which corresponds to unique information of the acquired electric signal, among unique information of the load specified reference electric signal stored in the storage unit 140, checks product information of a load corresponding to the unique information of the determined reference electric signal, and displays the checked product information of the load.

In addition, the control unit 130 controls such that the output unit 150 displays the product information for each load and the status of operation/non-operation for each load, and also displays the product information for each load and the power consumption for each load.

The unique information includes at least one of a waveform of an electric signal, a characteristic waveform included in an electric signal at a start operation, a noise component of a predetermined frequency band included in an electric signal, a harmonics component for a fundamental frequency included in an electric signal, a high frequency signal included in an electric signal, a power consumption, and a pattern information thereof.

The electric signal includes at least one of a power signal, a voltage signal and a current signal.

In addition, the unique information is either one of the power factor or the difference between an active power and a reactive power. The power factor represents the ratio of the active power to the apparent power that is calculated based on the current signal and the voltage signal. The difference between an active power and a reactive power is calculated based on the current signal and the voltage signal.

The control unit 130, if only the current signal and the current signal are transmitted from the measurement unit 120, may generate a power signal based on the transmitted voltage signal and the transmitted current signal, and acquires unique information based on the generated power signal.

In addition, the control unit 130, if only the current signal is transmitted from the measurement unit 120, may generate a power signal based on the transmitted current signal and a voltage signal that is stored in advance, and acquires unique information based on the generated power signal.

The control unit 130 acquires unique information corresponding to the unique information of the reference electric signal for each load collected by the information collecting unit 110.

The storage unit 140 stores a reference signal and product information for each of a plurality of loads. The storage unit 140 stores at least one unique information for each reference electric signal.

In addition, in a case that information for only a single load is stored, a reference electric signal and product information for the single load are stored.

The storage unit 140 may accumulate the power consumption of each load during a predetermined period of time, and store the accumulated power consumption.

The output unit 150 outputs the product information and the power consumption of the plurality of loads according to a command of the control unit 130, and outputs the product information or the operation/non-operation status of the load.

The output unit 150 includes at least either a display unit or a communication unit.

The display unit displays the product information and the power consumption of the plurality of loads, and the communication unit transmits the power consumption and the product information of each load to an external display apparatus such that the product information and the power consumption of the plurality of loads are displayed.

In addition, the information collected by the information collecting unit and the electric signal measured by the measurement unit may be transmitted to the external display unit, and unique information of the electric signal may be compared and a load in operation may be determined by the external display apparatus and then the product information and the power consumption of the plurality of loads may be displayed.

Figure 2:
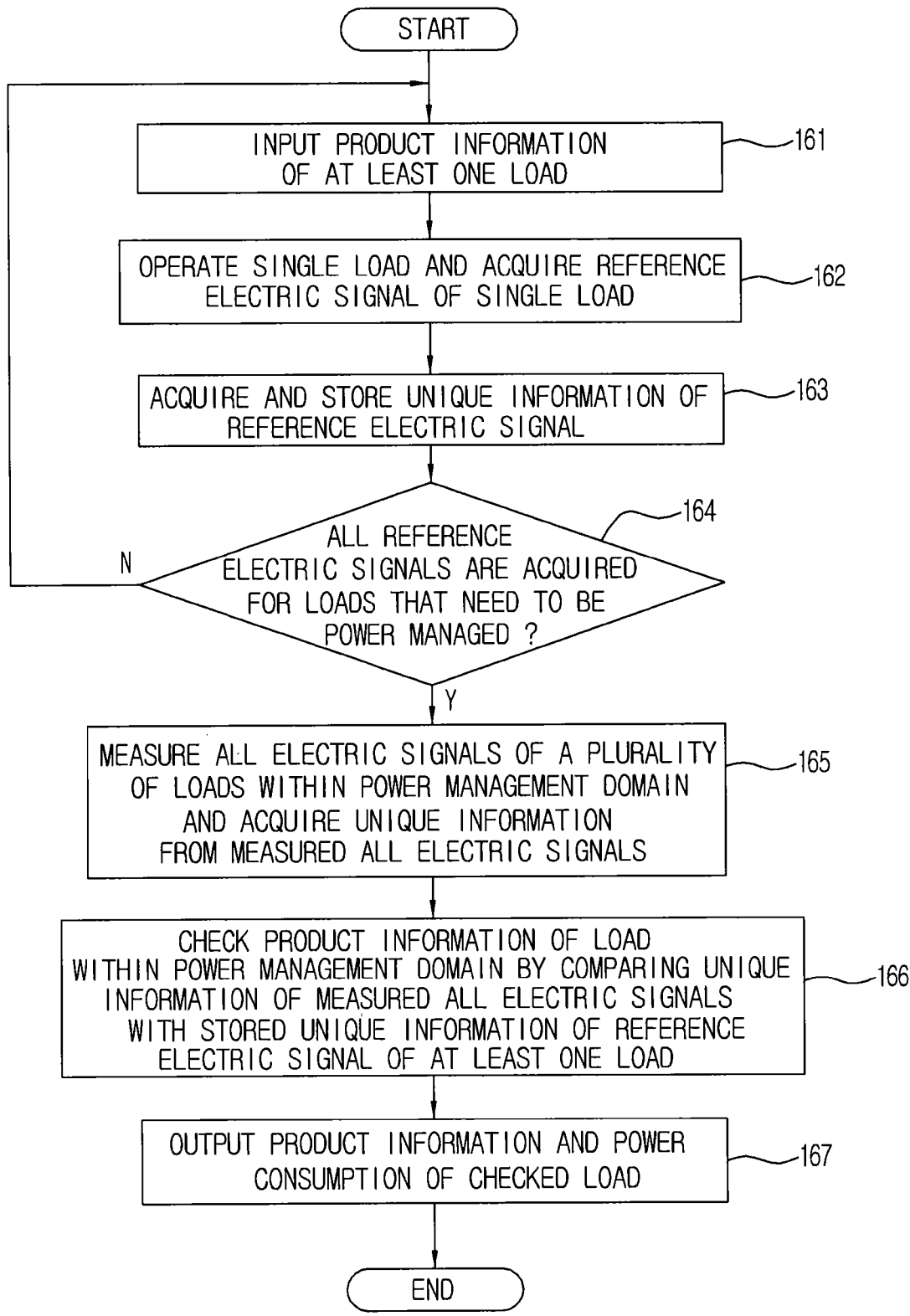
FIG. 2 is a flow chart of the power management apparatus in accordance with the embodiment of the present disclosure.

FIG. 2 is a flow chart of the power management apparatus in accordance with the embodiment of the present disclosure. Hereinafter, the operation of the power management apparatus will be described with reference to FIG. 2 in conjunction with FIGS. 1 and 3.

The power management apparatus 100, if the on-button of the information collecting unit 110 is input, turns on the power of the information collecting unit 110 and selects one of the plurality of loads through the information collecting unit 110.

Selecting one among the plurality of loads may represent selecting one among the plurality of switches to the on-state such that a load connected to the corresponding switch is electrically connected to the information collecting unit 110.

In this case, selecting one of the loads may represent allowing one of the switches to the on-state through a selection by a user such that a load connected to the corresponding switch is electrically connected to the information collecting unit 110.

In this case, a user directly inputs product information of the load connected to the corresponding switch. If the user has a difficulty in checking the connection between the switch and the plurality of loads, the user may check the status of operation/non-operation of the loads at a later time and input product information of the checked load.

That is, the power management apparatus may receive product information of a load selected by a user (161).

Thereafter, the power management apparatus, if the collection button is input through the information collecting unit 110, receives a reference electric signal from the measurement unit 120 while operating the selected load for a predetermined period of time (162), and stops the operation of the selected load after the predetermined period of time.

In this case, a user may check the load in operation and input product information of the checked load.

In addition, the power management apparatus, if the collection button is input through the information collecting unit 110, receives a reference electric signal from the measurement unit 120 while operating the selected load, and stops the operation of the selected load if the collection button is input again.

The electric signal includes at least one of the power signal, the voltage signal and the current signal.

The power management apparatus 100, if the reference electric signal is transmitted, acquires unique information, which represents a feature of the selected load, from the transmitted reference electric signal. In this case, the acquired unique information may be at least one unique information.

Thereafter, the power management apparatus 100 stores the unique information and the product information of the reference electric signal of the selected load (163).

As the off-button is input, the power management apparatus 100 determines whether reference electric signals of all loads, which are needed to be managed within a power management domain, are acquired (164).

That is, if the collection button of the information collecting unit 110 is additionally input, the power management apparatus 100 acquires and stores the reference electric signal and the unique information of another load by performing the operations 161 to 163. If the off-button is input, the acquiring of the reference electric signal and the unique information of the load is completed, and the power of the information collecting unit is turned off.

Thereafter, the power management apparatus measures the electric signals of the loads, which need to be managed within the power management domain, through the measurement unit 120, acquires unique information of the measured electric signals (165), compares the unique information of the reference electric signal for each load stored in the storage unit 140 with the unique information of the acquired electric signal to determine unique information of a reference electric signal corresponding to the acquired electric signal, checks product information of a load corresponding to the determined unique information of the reference electric signal (166), and outputs the checked product information of the load and power consumption of the load within the power management domain (167).

In addition, the power management apparatus may output the product information and the status of operation/non-operation of the load.

The outputting of the product information and the power consumption of the load includes displaying the product information and the power consumption of the load through a display unit provided on the power management apparatus.

In addition, the outputting of the product information and the power consumption of the load includes transmitting the product information and the power consumption of the load to an external display apparatus through a communication unit provided on the power management apparatus.

The unique information of the electric signal includes at least one of a waveform of an electric signal, a characteristic waveform included in an electric signal at a start operation, a noise component of a predetermined frequency band included in an electric signal, a harmonics component for a fundamental frequency included in an electric signal, a high frequency signal included in an electric signal, a power consumption, and a pattern information thereof.

In addition, the unique information includes at least one of the power factor, which represents the ratio of the active power to the apparent power that are calculated based on the current signal and the voltage signal of the electric signal, and the difference between the active power and the reactive power that are calculated based on the current signal, and the voltage signal.

Figure 3:
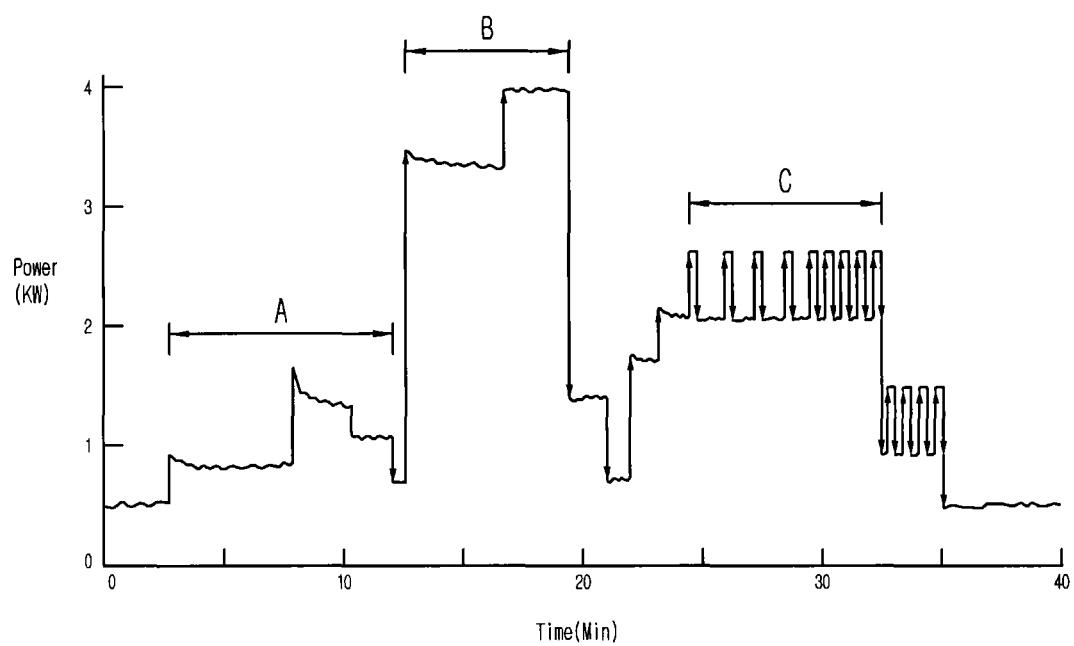
FIG. 3 is a view illustrating power patterns of a plurality of loads, which are stored in the power management apparatus in accordance with the embodiment of the present disclosure.

FIG. 3 is a view illustrating unique information of reference electric signals of a plurality of loads, in which the waveform (A) of a power signal for a first load, the waveform (B) of a power signal for a second load, and the waveform (C) of a power signal of a $n^{th}$ load are shown.

That is, referring to FIG. 3, the waveforms of the power signals vary among the loads, and the power consumptions vary among the loads.

Hereinafter, a process of comparing the unique information of the electric signal will be described in relation that the unique information of the electric signal is waveform pattern information of the power signal.

The power management apparatus, if a power signal is measured through the measurement unit, acquires a pattern of the waveform of the measured power signal.

The power management apparatus, if only a voltage signal and a current signal are measured through the measurement unit 120, generates a power signal by use of the measured voltage signal and the current signal, and acquires the pattern of the waveform of the generated power signal.

In addition, the power management apparatus, if only a current signal is measured through the measurement unit 120, generates a power signal by use of the measured current signal and a voltage, which is stored in advance, and acquires the pattern of the waveform of the generated power signal.

Thereafter, the power management apparatus extracts patterns of waveforms of a plurality of reference power signals from a plurality of pieces of unique information of a plurality of reference electric signals that are stored in the storage unit, finds a pattern of waveform of a reference power signal, which corresponds to a pattern of waveform of the acquired power signal, among the patterns of waveforms of the extracted reference power signals, and checks product information of a load corresponding to the found pattern of waveform of the reference power signal.

As such, the power management apparatus measures the total of power in the power management domain, and analyzes the unique information of each load included in the measured power signal based on the pattern recognition of power signals, that is, Non Intrusive Load Monitoring (NILM), thereby obtaining the status of operation/non-operation of each load and the power consumption of each load.

Figure 4:
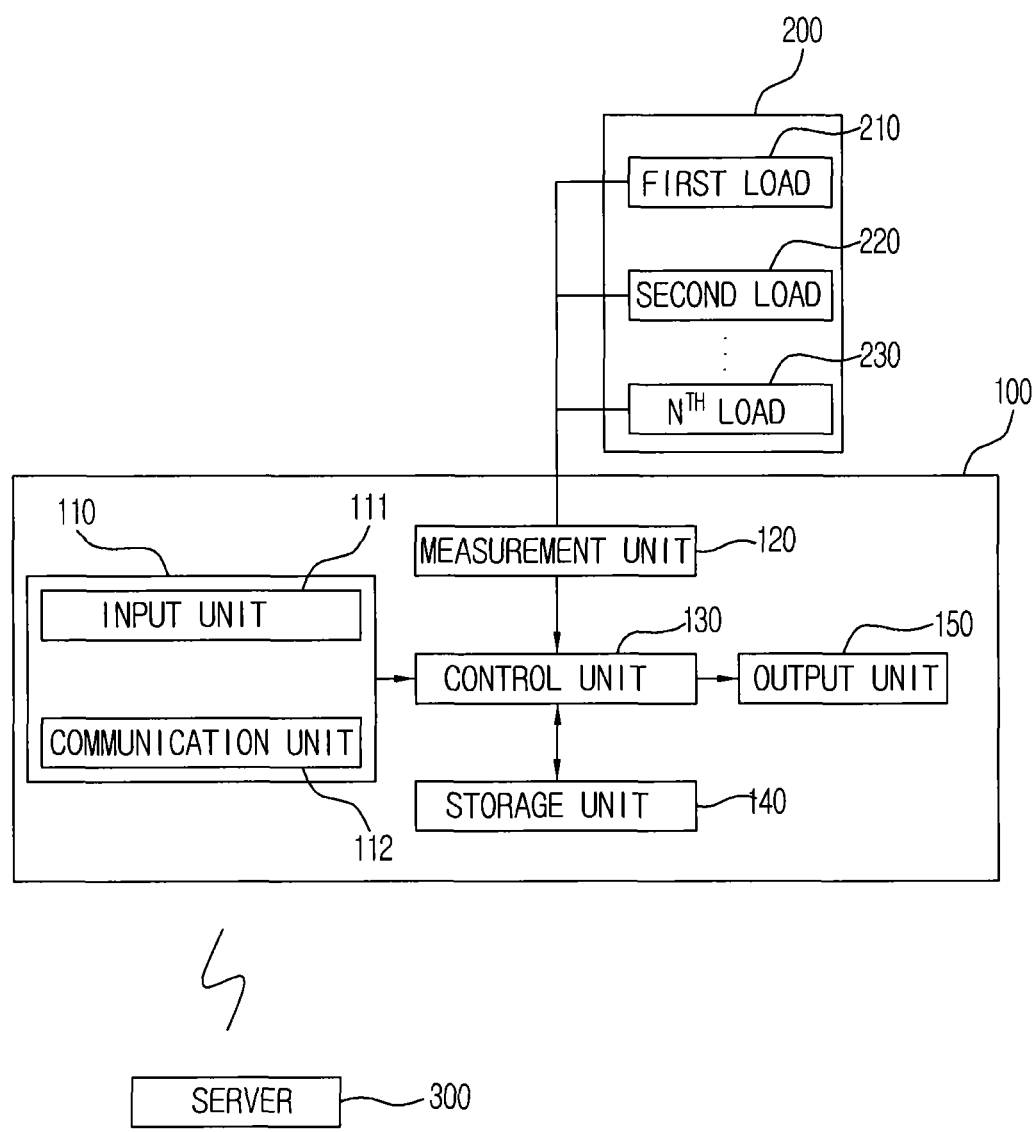
FIG. 4 is a block diagrams illustrating a power management apparatus in accordance with another embodiment of the present disclosure.

FIG. 4 is a block diagram illustrating a power management apparatus in accordance with another embodiment of the present disclosure. The power management apparatus 100 includes an information collecting unit 110, a measurement unit 120, a control unit 130, a storage unit 140, and an output unit 150. In the following description, the same reference numerals will be assigned to the same elements of the previous embodiment and details thereof will be omitted in order to avoid redundancy.

The information collecting unit 110 collects the electric signal and the product information of at least one of a plurality of loads provided within the power management domain.

The information collecting unit 110 includes an input unit 111, on which an on/off button, a plurality of letter buttons and a plurality of number buttons are provided, and a communication unit 112 configured to communicate with an external server 300.

The on/off button is a button configured to receive a power on/off command of the information collecting unit 110, and the plurality of letter buttons and number buttons are configured to receive the name of a load, the name of a product, a serial number, the model name, the model number, the product number, and the family of a product (for example, the refrigerator family, the air conditioner family and the television family).

The information collecting unit 110, if at least one product information is input through the input unit 111, transmits the input product information through the communication unit 112, thereby requesting a reference electric signal corresponding to the input product information from the server 300.

The information collecting unit 110, if the reference electric signal is received through the communication unit 112, stores the received electric signal and the input product information. In addition, the information collecting unit 110 acquires unique information of the received reference electric signal and the acquired unique information of the reference electric signal.

In addition, the information collection unit 110 may directly receive the unique information of the reference electric signal from the server 300.

In this case, the reference electric signal provided by the server and unique information may be transmitted to the storage unit 140 and stored in the storage unit.

The information collecting unit 110 may request reference electric signals of a plurality loads from the server 300.

The unique information includes at least one of a waveform of a power signal of an electric signal, a characteristic waveform included in a power signal at a start operation, a noise component of a predetermined frequency band included in a power signal, a harmonics component for a fundamental frequency included in a power signal, a high frequency signal included in a power signal, a power consumption, and a pattern information thereof.

In addition, the unique information includes at least one of a waveform of a voltage signal of an electric signal, a characteristic waveform included in a voltage signal at a start operation, a noise component of a predetermined frequency band included in a voltage signal, a harmonics component for a fundamental frequency included in a voltage signal, a high frequency signal included in a voltage signal, and a pattern information thereof.

In addition, the unique information includes at least one of a waveform of a current signal of an electric signal, a characteristic waveform included in a current signal at a start operation, a noise component of a predetermined frequency band included in a current signal, a harmonics component for a fundamental frequency included in a current signal, a high frequency signal included in a current signal, and a pattern information thereof.

In addition, the unique information includes at least one of the power factor, which represents the ratio of the active power to the apparent power that are calculated based on the current signal and the voltage signal of the electric signal, and the difference between the active power and the reactive power calculated based on the current signal and the voltage signal.

The information collecting unit 110 acquires at least one of unique information in order to recognize the load.

The measurement unit, the control unit, and the output unit illustrated on FIG. 4 are identical to those according to the previous embodiment, and the description thereof will be omitted.

Figure 5:
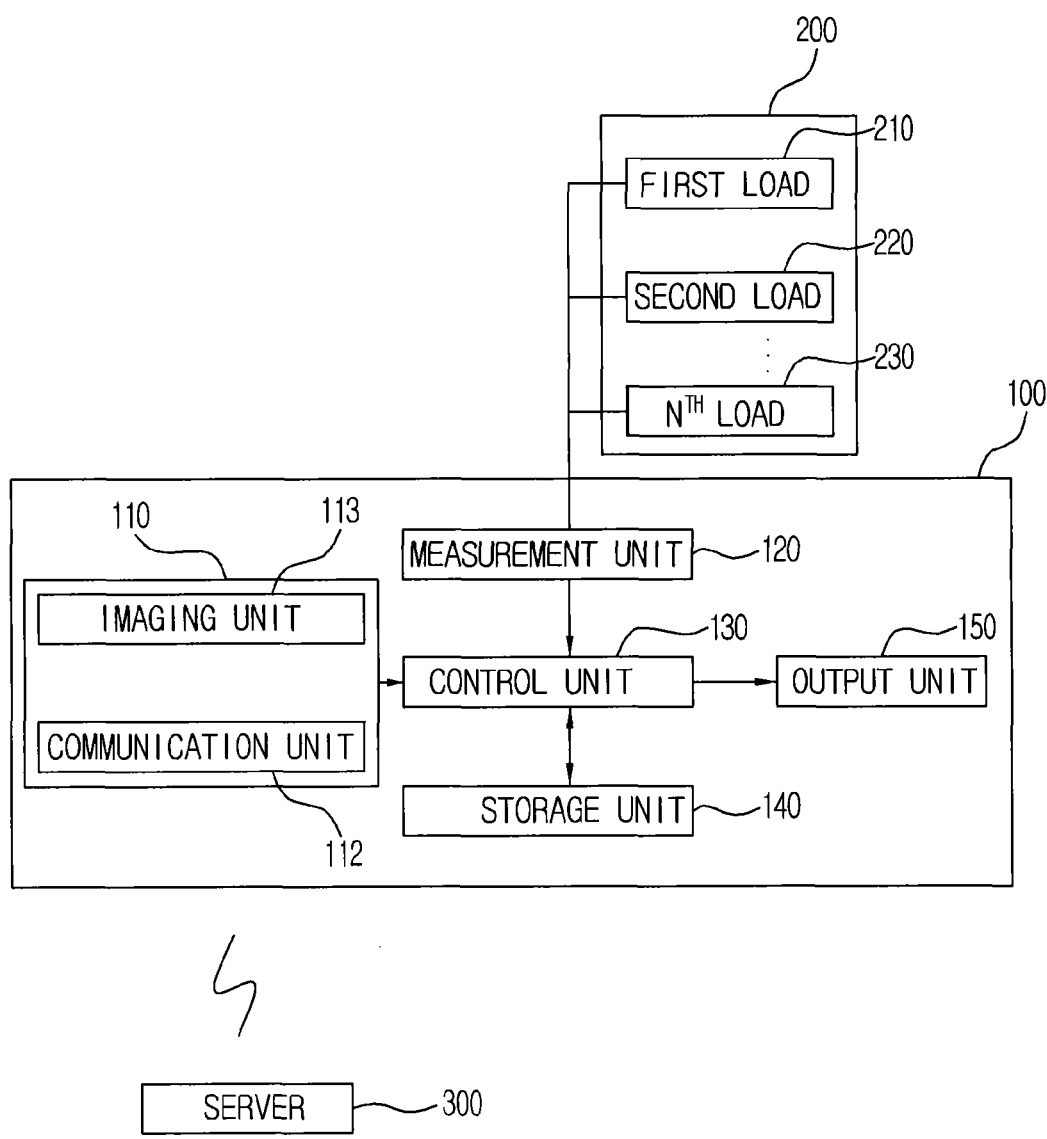
FIG. 5 is a block diagram illustrating a power management apparatus in accordance with another embodiment of the present disclosure.

FIG. 5 is a block diagram illustrating power management apparatus in accordance with another embodiment of the present disclosure. The power management apparatus 100 includes an information collecting unit 110, a measurement unit 120, a control unit 130, a storage unit 140, and an output unit 150. In the following description, the same reference numerals will be assigned to the same elements of the previous embodiment and details thereof will be omitted in order to avoid redundancy.

The information collecting unit 110 collects the electric signal and the product information of at least one of a plurality of loads provided within a power management domain.

The information collecting unit 110 includes a communication unit 112 configured to communicate with an external server 300 and an imaging unit 113 configured to acquire an image.

The information collecting unit 110, if a code image attached to a load, such as a bar code or QR code, is input through the imaging unit 130, reads the input code image to acquire product information such as the manufacturing company of the load, and transmits the product information to the server 300 of the manufacturing company to request a reference electric signal corresponding to the product information.

The information collecting unit 110, if the reference electric signal is received through the communication unit 112, stores the received electric signal and the input product information. In addition, the information collecting unit 110 acquires unique information of the received reference electric signal and stores the acquired unique information of the reference electric signal.

In addition, the information collecting unit 110 may directly receive the unique information of the reference electric signal from the server 300.

The information collecting unit 110 may simultaneously transmit a plurality of code images to the server to simultaneously receive reference electric signals of a plurality of loads.

The measurement unit, the control unit, and the output unit illustrated on FIG. 5 are identical to those according to the previous embodiment, and the description thereof will be omitted.

Figure 6:
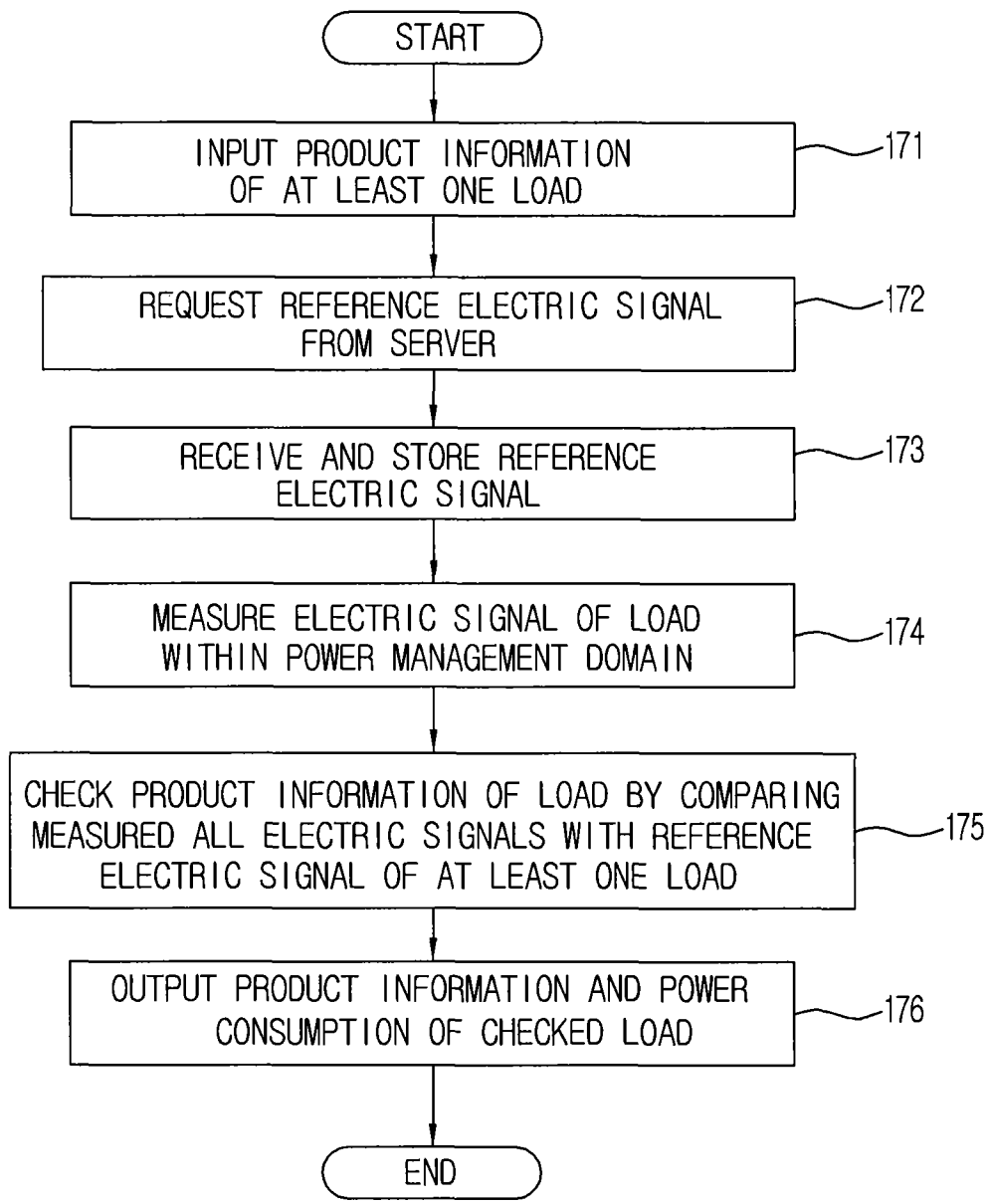
FIG. 6 is a flow chart of the power management apparatus in accordance with the other embodiments of the present disclosure.

FIG. 6 is a flow chart of the power management apparatus in accordance with the other embodiments of the present disclosure. The operation of power management apparatus will be described with reference to FIG. 6 in conjunction with FIGS. 4 and 5.

The power management apparatus 100 receives at least one product information among the name of a load, the name of a product, the serial number, the model name, the model number, the product number, and the family of a product (for example, the refrigerator family, the air conditioner family and the television family) through the input unit 111 through the information collecting unit 110 (171).

Thereafter, the power management apparatus 100 transmits the input product information through the communication unit 112, thereby requesting a reference electric signal corresponding to the input product information from a server 300 (172).

In addition, the information collecting unit 110 acquires a code image, such as a bar code or a QR code attached to a load, through the imaging unit 113 of the information collecting unit 110, and reads a code of the acquired code image to acquire product information such as the manufacturing company of the load. The information collecting unit 110 transmits the product information to the server 300 of the corresponding manufacturing company through the communication unit 112, thereby requesting a reference electric signal corresponding to the product information from the server.

The information collecting unit 110, if the reference electric signal is received through the communication unit 112, stores the received electric signal and the acquired product information (173).

In addition, the information collecting unit 110 may acquire unique information of the received reference electric signal and store the acquired unique information of the reference electric signal. In addition, the power management apparatus may directly receive the unique information of the reference electric signal from the server and store the received unique information.

The reference electric signal and the unique information may be acquired and stored as a load is added.

The electric signal includes at least one of a power signal, a voltage signal, and a current signal.

Thereafter, the power management apparatus measures the electric signals of the loads, which need to be managed within the power management domain, through the measurement unit 120, acquires unique information of the measured electric signals (174), compares the unique information of the reference electric signal for each load stored in the storage unit 140 with the unique information of the acquired electric signal to determine unique information of a reference electric signal corresponding to the acquired electric signal, checks product information of a load corresponding to the determined unique information of the reference electric signal (175), and outputs the checked product information of the load and power consumption of the load (176).

In addition, the power management apparatus may output the product information and the status of operation/non-operation of the load.

The outputting of the product information and the power consumption of the load includes displaying the product information and the power consumption of the load through a display unit provided on the power management apparatus.

In addition, the outputting of the product information and the power consumption of the load includes transmitting the product information and the power consumption of the load to an external display apparatus through a communication unit provided on the power management apparatus.

Figure 7:
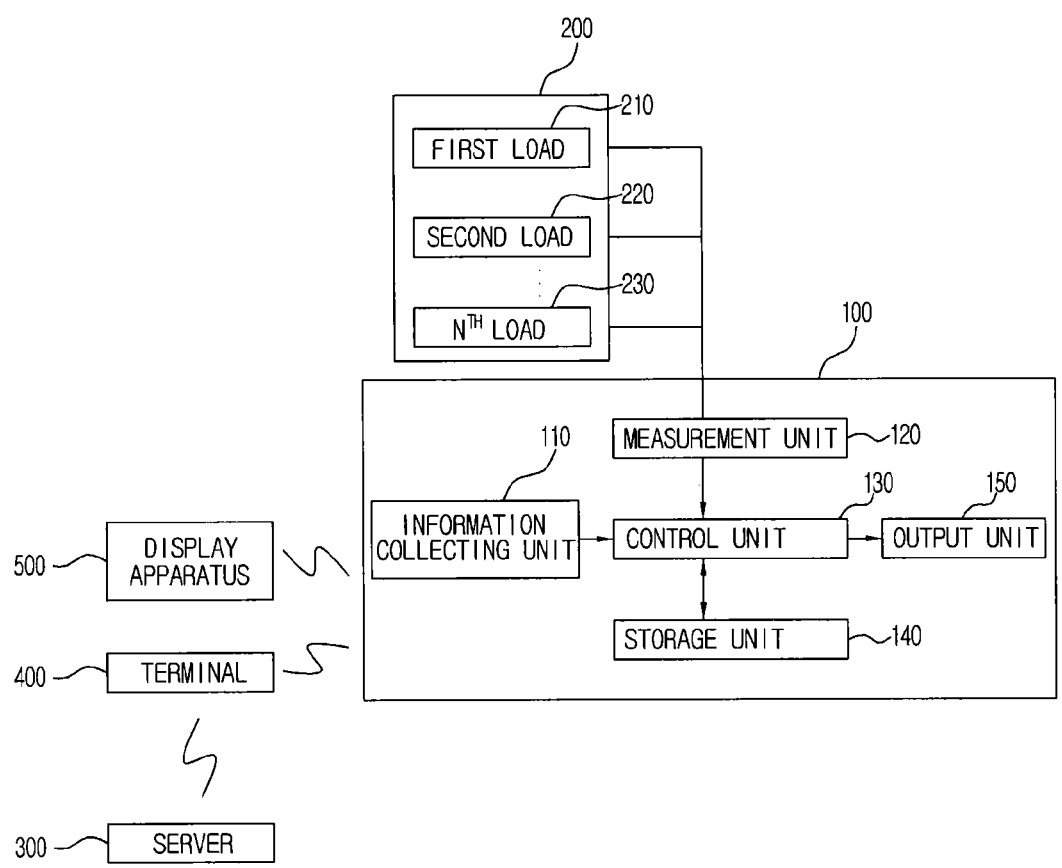
FIG. 7 is a block diagram illustrating a power management apparatus in accordance with another embodiment of the present disclosure.

FIG. 7 is a block diagram illustrating a power management apparatus in accordance with another embodiment of the present disclosure. The power management apparatus 100 includes an information collecting unit 110, a measurement unit 120, a control unit 130, and a storage unit 140. In the following description, the same reference numerals will be assigned to the same elements of the previous embodiment and details thereof will be omitted in order to avoid redundancy.

The information collecting unit 110 collects an electric signal and product information of at least one of a plurality of loads provided in a power management domain.

The information collecting unit 110 includes a communication unit configured to communicate with a server 300, a terminal 400, and a display apparatus 500 that are provided outside the information collecting unit 110.

The information collecting unit 110, if product information and a reference electric signal of a load are input through the communication unit, stores the received product and reference electric signal of the load. In addition, the information collecting unit 110 acquires unique information of the received reference electric signal, and stores the acquired reference electric signal.

In addition, the information collecting unit 110 may directly receive the unique information of the reference electric signal from at least one of the terminal 400 and the server 300.

The reference electric signal and unique information provided from at least one of the terminal 400 and the server 300 may be transmitted to the storage unit 140 and stored in the storage unit 140.

Alternatively, the information collecting unit 110, if at least one product among the model name, the product name and the family of the product (the refrigerator family, the air conditioner family and the television family), the serial number, and the product number is input from the terminal 400, a key pad or a remote controller of a television, may request a reference electric signal corresponding to the received product information from the server 300.

Alternatively, the information collecting unit 110, if a code image is transmitted through the terminal 400, may transmit the code image to the server, thereby requesting a reference electric signal corresponding to the code image of the load.

Alternatively, the information collecting unit 110, if a code image is transmitted through the terminal 400, may acquire product information by reading a code of the transmitted code image and require a reference electric signal corresponding to the product information.

Alternatively, the information collecting unit 110, after one among a plurality of loads is selected, receives product information of the load and a command signal to operate the load through the terminal 400, a keypad, or a remote control of a television.

As described through the previous embodiment, the information collecting unit 110 controls the operation of the selected load, acquires an electric signal of the load from the measurement unit 120, acquires unique information of the electric signal, and transmits product information, the electric signal, and the unique information of the load to the storage unit 140 such that the product information, the electric signal, and the unique information are stored.

Selecting one of the loads may represent allowing a switch, which is connected to a desired load, to the on-state such that the load is electrically connected to the information collecting unit.

That is, the information collecting unit illustrated on FIG. 7 is identical to that of the previous embodiment, and details thereof will be omitted.

The measurement unit, the control unit, and the output unit illustrated on FIG. 7 are identical to those according to the previous embodiment, and the description thereof will be omitted.

The server 300 may be individually provided for each manufacturing company of a load, or may be integrally provided for the manufacturing companies of loads.

The server 300 stores the product information, the reference electric signal, and the unique information for each load, and provides at least one of the reference electric signal and the unique information in response to a request by the terminal 400 or the information collecting unit 110 of the power management apparatus.

Various types of information stored in the server 300 may be updated.

The terminal 400 includes an input unit provided with an on/off button, a plurality of letter buttons, and a plurality of number buttons and configured to receive product information, a communication unit configured to communicate with a server, an imaging unit configured to acquire a code image provided on a load, and a terminal control unit configured to acquire product information by reading input product information or a code image, to request a reference electric signal of a load from the server 300 and to transmit the received reference electric signal to the power management apparatus 100.

In addition, the terminal 400 may transmit product information input by a user and a code image acquired by a user to the power management apparatus 100.

The terminal 400 includes a mobile phone, a computer (personal computer), and a tablet.

The terminal 400 is provided with an application that is configured to display the product information, the power consumption, and the status of operation/non-operation for each load, which are transmitted from the power management apparatus.

The display apparatus 500 is provided with a power management button such that information of a load is displayed if the power management button is selected by a user.

In addition, the power management apparatus may be embedded into the display apparatus 500.

Figure 8:
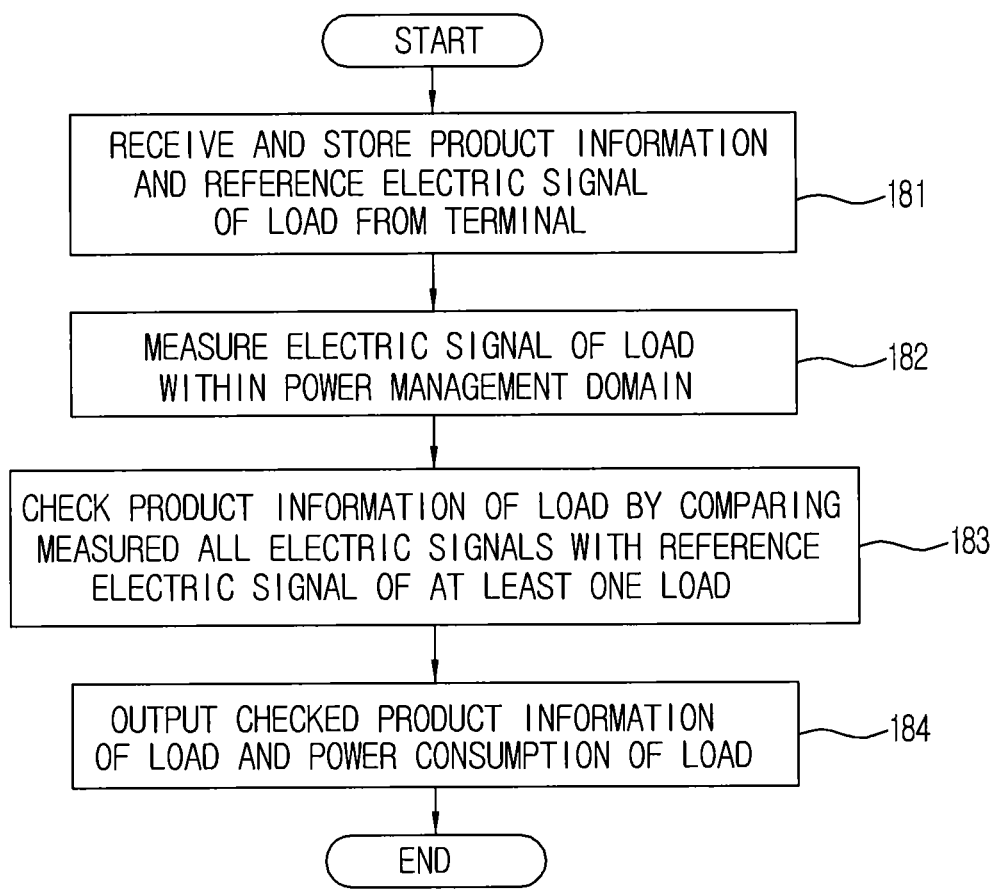
FIG. 8 is a flow chart of the power management apparatus in accordance with the other embodiment of the present disclosure.

FIG. 8 is a flow chart of the power management apparatus in accordance with the other embodiment of the present disclosure.

The terminal 400, if an application for power management is selected by a user, executes the selected application, and if product information is input by a user, requests at least one of a reference electric signal and unique information of the input product information from the server 300.

In addition, the terminal 400, if a code image of a load is acquired from a user, acquires product information by reading a code of the acquired code image, and requests at least one of a reference electric signal and unique information corresponding to the acquired product information from the server 300.

The terminal 400, if at least one of the reference electric signal and the unique information is received from the server 300 according to the request, transmits the received reference electric signal and the unique information to the power management apparatus 100.

The power management apparatus 100, if at least one product information among the name of a load, the product name, the serial number, the model name, the model number, the product number and the family of a product (the refrigerator family, the air conditioner family and the television family), and the reference electric signal are received from the terminal 400 and the server 300 at outside the power management apparatus 100, stores the received product information and the received reference electric signal (181).

In addition, the power management apparatus 100, if the product information or the code image is received by the information collecting unit 110, may directly request a reference electric signal from the server.

Thereafter, the power management apparatus 100 acquires unique information corresponding to the reference electric signal that is received through the information collecting unit 110, and stores the acquired unique information.

The electric signal includes at least one of a power signal, a voltage signal, and a current signal.

Thereafter, the power management apparatus measures the electric signals of the loads, which need to be managed within the power management domain, through the measurement unit 120, acquires unique information of the measured electric signals (182), compares the unique information of the reference electric signal for each load stored in the storage unit 140 with the unique information of the acquired electric signal to determine unique information of a reference electric signal corresponding to the acquired electric signal, checks product information of a load corresponding to the determined unique information of the reference electric signal (183), and outputs the checked product information of the load and power consumption of the load (184). In addition, the power management apparatus may output the product information and the status of operation/non-operation of the load.

The outputting of the product information and the power consumption of the load includes displaying the product information and the power consumption of the load through a display unit provided on the power management apparatus.

In addition, the outputting of the product information and the power consumption of the load includes transmitting the product information and the power consumption of the load to an external display apparatus through a communication unit provided on the power management apparatus.

As described above, the reference electric signal of each load is acquired in advance, and electric signals of loads are distinguished among the total of electric signals, thereby enhancing the efficiency in recognizing each load.

In addition, the accuracy of analyzing the power consumption of each load is improved, so that the power consumption is effectively reduced and the efficiency in use of the load is enhanced.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A power management apparatus comprising:
   an information collecting unit configured to collect unique shape information regarding a shape of at least one reference electric signal and at least one product information that correspond to at least one load;
   a control unit configured to control a storage of the unique shape information regarding the shape of the at least one reference electric signal and the at least one product information that correspond to the at least one load; and
   a storage unit configured to store the unique shape information regarding the shape of the at least one reference electric signal and the collected at least one product information that correspond to the at least one load, wherein the at least one reference electric signal comprises at least one of a power signal, a voltage signal, and a current signal.

2. The power management apparatus of claim 1, further comprising:
a measurement unit configured to measure signal shape information from all electric signals of a plurality of loads provided in a power management domain,
wherein the control unit controls such that unique shape information of an electric signal corresponding to the stored unique shape information regarding the shape of the at least one reference electric signal is checked among the measured signal shape information from all electric signals, product information corresponding to the checked electric signal is checked, power consumption corresponding to the checked electric signal is checked, and the checked product information and the checked power consumption are displayed.

3. The power management apparatus of claim 2, wherein the information collecting unit comprises an input unit configured to receive the product information of the load and a collection command, which are used to collect the unique shape information regarding the shape of the at least one reference electric signal of the load, and
the control unit, if the product information of the load and the collection command are input, operates the load, of which the product information is input, during a predetermined period of time, and receives the unique shape information regarding the shape of the at least one reference electric signal from the measurement unit while the load, of which the product information is input, is being operated.

4. The power management apparatus of claim 2, wherein the information collecting unit comprises an input unit configured to receive the product information of the load and a start command and a finish command, the start command and the finish command used to collect the unique shape information regarding the shape of the at least one reference electric signal of the load, and
the control unit operates the load, of which the product information is input, during a period of time from receiving the start command to receiving the finish command, and receives the unique shape information regarding the shape of the at least one reference electric signal from the measurement unit while the load, of which the product information is input, is being operated.

5. The power management apparatus of claim 2, further comprising an output unit configured to output product information of the checked load, a status of operation/non operation of the checked load, and power consumption of the checked load.

6. The power management apparatus of claim 2, further comprising a communication unit configured to communicate with an external display apparatus,
wherein the control unit outputs the product information of the checked load and the power consumption of the checked load to the output unit.

7. The power management apparatus of claim 2, wherein the information collecting unit acquires unique information from the at least one reference electric signal, including the unique shape information regarding the shape of the at least one reference electric signal, corresponding to the at least one load;
the storage unit stores the unique information of the at least one reference electric signal corresponding to the at least one load, the unique information acquired by the information collecting unit;
the control unit acquires unique information from the measured electric signal, and determines unique information of a reference electric signal, corresponding to the unique information of the measured electrics signal, among the unique information of the at least one reference electric signal of the at least one load stored in the storage unit.

8. The power management apparatus of claim 7, wherein the measurement unit measures at least one of power, voltage, and current, and outputs at least one of the power signal, the voltage signal, and the current signal.

9. The power management apparatus of claim 8, wherein the unique information is a high frequency signal within the at least one of the power signal, the current signal, and the voltage signal.

10. The power management apparatus of claim 8, wherein the unique information is a harmonics component within the at least one of the power signal, the current signal, and the voltage signal.

11. The power management apparatus of claim 8, wherein the unique information is an active power and a reactive power that are calculated based on the voltage signal and the current signal.

12. The power management apparatus of claim 1, wherein the information collecting unit comprises an input unit configured to receive the product information of the load and a communication unit configured to communicate with a server,
wherein the control unit controls such that a reference electric signal corresponding to the product information input is requested and unique shape information regarding a shape of the requested reference electric signal received through the communication unit is stored.

13. The power management apparatus of claim 1, wherein the information collecting unit comprises an imaging unit configured to acquire a code image provided on the load, and a communication unit configured to communicate with a server,
wherein the control unit controls such that a reference electric signal corresponding to the code image is requested from a server and unique shape information regarding a shape of the requested reference electric signal received through the communication unit is stored.

14. The power management apparatus of claim 1, wherein the information collecting unit comprises a communication unit configured to communicate with a terminal,
wherein the control unit controls a storage of the product information of the load and the at least one reference electric signal of the load which are transmitted from the terminal through the communication unit.

15. The power management apparatus of claim 1, wherein the information collecting unit comprises at least one of an input unit, an imaging unit, and a communication unit, the input unit configured to receive a command to collect the product information of the load and the at least one reference electric signal of the load, the imaging unit configured to acquire a code image of the load, and the communication unit configured to communicate with a server,
wherein the control unit, if the command to collect the at least one reference electric signal of the load is input, operates the load and receives the at least one reference electric signal, which is measured during the operation of the load, and if at least one of the product information of the load and the code image of the load is input, controls such that a server is requested of the unique shape information regarding the shape of the at least one a-reference electric signal to acquire the unique shape information regarding the at least one reference electric signal.

16. The power management apparatus of claim 7, wherein the unique information comprises at least two of a high frequency signal within the power signal, a high frequency signal within the current signal, a high frequency signal within the voltage signal, a harmonics component within the power signal, a harmonics component within the current signal, a harmonics component within the voltage signal, and an active power and a reactive power that are calculated based on the voltage signal and the current signal.

17. A power management apparatus comprising:
an information collecting unit configured to collect at least one reference electric signal and at least one product information that correspond to at least one load;
a control unit configured to control a storage of the at least one reference electric signal and the at least one product information that correspond to the at least one load;
a storage unit configured to store the collected at least one reference electric signal and the collected at least one product information that correspond to the at least one load; and
a measurement unit configured to measure all electric signals of a plurality of loads provided in a power management domain,
wherein the control unit controls such that an electric signal corresponding to the stored at least one reference electric signal is checked among the all electric signals, product information corresponding to the checked electric signal is checked, power consumption corresponding to the checked electric signal is checked, and the checked product information and the checked power consumption are displayed,
wherein the information collecting unit acquires unique information from the at least one reference electric signal corresponding to the at least one load,
the storage unit stores the unique information of the at least one reference electric signal corresponding to the at least one load, the unique information acquired by the information collecting unit,
the control unit acquires unique information from the measured electric signal, and determines unique information of a reference electric signal, corresponding to the unique information of the measured electrics signal, among the unique information of the at least one reference electric signal of the at least one load stored in the storage unit, and
wherein the unique information comprises at least two of a high frequency signal within the power signal, a high frequency signal within the current signal, a high frequency signal within the voltage signal, a harmonics component within the power signal, a harmonics component within the current signal, a harmonics component within the voltage signal, and an active power and a reactive power that are calculated based on the voltage signal and the current signal.

18. A method for controlling a power management, the method comprising:
receiving product information of a load;
operating the load if an operation command for the load is input;
measuring an electric signal of the load, to collect unique shape information regarding a shape of the electric signal, while the load is being operated;
storing the unique shape information regarding the shape of the measured electric signal as unique shape information regarding a shape of a reference electric signal of the load;
measuring all electric signals of a plurality of loads provided in a power management domain;
checking unique shape information of an electric signal, corresponding to the stored unique shape information regarding the shape of the reference electric signal, among all the electric signals;
checking power consumption corresponding to the electric signal with the checked unique shape information, among all the electric signals; and
outputting the checked power consumption,
wherein the reference electric signal comprises at least one of a power signal, a voltage signal, and a current signal.

19. The method of claim 18, further comprising:
checking product information corresponding to the electric signal with the checked unique shape information; and
outputting the checked product information.

20. The method of claim 18, wherein the operating of the load comprises operating the load during a predetermined period of time.

21. The method of claim 18, wherein the operating of the load comprises:
operating the load during a time from receiving a start command to receiving a finish command, the start command and the finish command configured to collect the unique shape information regarding the shape of the reference electric signal of the load.

22. The method of claim 19, wherein the outputting of the checked product information of the load and the checked power consumption of the load comprises:
outputting the checked product information and the checked power consumption to an external display apparatus through communication.

* * * * *